United States Patent
Ko et al.

(10) Patent No.: US 12,164,354 B2
(45) Date of Patent: Dec. 10, 2024

(54) ELECTRONIC CONTROL DEVICE AND METHOD FOR DIAGNOSING WAKE-UP CIRCUIT

(71) Applicant: Hitachi Astemo, Ltd., Hitachinaka (JP)

(72) Inventors: Kenho Ko, Hitachinaka (JP); Hiroshi Tomizawa, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 96 days.

(21) Appl. No.: 18/024,219

(22) PCT Filed: Sep. 10, 2021

(86) PCT No.: PCT/JP2021/033311
§ 371 (c)(1),
(2) Date: Mar. 1, 2023

(87) PCT Pub. No.: WO2022/075006
PCT Pub. Date: Apr. 14, 2022

(65) Prior Publication Data
US 2023/0288975 A1    Sep. 14, 2023

(30) Foreign Application Priority Data
Oct. 7, 2020   (JP) ................................. 2020-169737

(51) Int. Cl.
*G06F 1/3206*   (2019.01)
*G01R 31/28*    (2006.01)

(52) U.S. Cl.
CPC ....... *G06F 1/3206* (2013.01); *G01R 31/2837* (2013.01)

(58) Field of Classification Search
CPC .................................................. G06F 1/3206
See application file for complete search history.

(56) References Cited

U.S. PATENT DOCUMENTS 7,673,949 B2 *  3/2010  Kuramochi ............. B60T 8/885
                                                    303/122.03
10,497,189 B2 * 12/2019 Utagawa ................. H04L 67/14
(Continued)

FOREIGN PATENT DOCUMENTS

JP   2003-139874 A    5/2003
JP   2009-202822 A    9/2009
(Continued)

OTHER PUBLICATIONS

International Preliminary Report on Patentability (PCT/IB/326, PCT/IB/338 & PCT/IB/373) issued in PCT Application No. PCT/JP2021/033311 dated Apr. 20, 2023, Including English translation of document C2 (Japanese-language Written Opinion (PCT/ISA/237), filed on Mar. 1, 2023) (10 pages).

(Continued)

*Primary Examiner* — Brian T Misiura
(74) *Attorney, Agent, or Firm* — Crowell & Moring LLP

(57) ABSTRACT

An electronic control device includes: a microcomputer; a wake-up circuit; and a relay switch self-retaining a power relay, and the wake-up circuit operates the relay switch in response to a wake-up signal from an OTA electronic control device, and starts power supply to the microcomputer to cause starting-up. During shutdown processing for the microcomputer, the microcomputer outputs a stop command to the relay switch before outputting a stop command to the wake-up circuit, whereby an output terminal (INH terminal) of the wake-up circuit is diagnosed for fixation based on an output signal from the wake-up circuit.

14 Claims, 14 Drawing Sheets

(56) References Cited

U.S. PATENT DOCUMENTS

| | | | |
|---|---|---|---|
| 10,501,081 B2* | 12/2019 | Utagawa | B60T 7/12 |
| 2003/0093189 A1 | 5/2003 | Honda | |
| 2018/0057008 A1 | 3/2018 | Utagawa | |
| 2023/0324971 A1* | 10/2023 | Iwasaki | B60W 50/0205 714/14 |

FOREIGN PATENT DOCUMENTS

| | | |
|---|---|---|
| JP | 2013-151288 A | 8/2013 |
| JP | 2016-172503 A | 9/2016 |

OTHER PUBLICATIONS

International Search Report (PCT/ISA/210) issued in PCT Application No. PCT/JP2021/033311 dated Nov. 22, 2021 with English translation (five (5) pages).
Japanese-language Written Opinion (PCT/ISA/237) issued in PCT Application No. PCT/JP2021/033311 dated Nov. 22, 2021 (three (3) pages).

* cited by examiner

ELECTRONIC CONTROL DEVICE AND METHOD FOR DIAGNOSING WAKE-UP CIRCUIT

TECHNICAL FIELD

The present invention relates to an electronic control device containing a wake-up circuit and a method for diagnosing a wake-up circuit.

BACKGROUND ART

In the automotive industry, there is being examined a technique for rewriting an application program, control data or the like (hereinafter abbreviated as "application program") of an electronic control device by utilizing OTA (over the air) in which data communication is performed by a wireless network. It is desirable for the rewriting of an application program utilizing OTA to be possible even in a state in which a microcomputer has not started up. Thus, as disclosed in JP 2013-151288 A (Patent Document 1), there has been proposed a technique in which a wake-up circuit is contained in an electronic control device and in which a microcomputer is started up by a wake-up signal from the outside to rewrite an application program.

REFERENCE DOCUMENT LIST

Patent Document

Patent Document 1: JP 2013-151288 A

SUMMARY OF THE INVENTION

Problem to be Solved by the Invention

In a wake-up circuit, when there is generated a fixed ON, in which an ON signal (start-up signal) is constantly output from a start-up signal output terminal, a microcomputer cannot be shut down after an application program has been rewritten. Furthermore, in a wake-up circuit, when there is generated a fixed OFF, in which an OFF signal is constantly output from a start-up signal output terminal, a microcomputer cannot be started up, and an application program cannot be rewritten.

It is accordingly an object of the present invention to provide an electronic control device and a method for diagnosing a wake-up circuit in which it is possible to diagnose whether or not a fixed ON or a fixed OFF is generated in the wake-up circuit.

Means for Solving the Problem

According to a first mode of the present invention, there is provided an electronic control device including a microcomputer, a wake-up circuit, and a relay switch self-retaining a power relay, in which the wake-up circuit operates the relay switch in response to a wake-up signal from the outside to start power supply to the microcomputer to cause starting-up. During shutdown processing, before the microcomputer outputs a stop command to the wake-up circuit, a stop command is output to the relay switch, whereby an output terminal of the wake-up circuit is diagnosed as being fixed based on an output signal from the wake-up circuit.

According to a second mode of the present invention, there is provided an electronic control device including a wake-up circuit operating a relay switch self-retaining a power relay in response to a wake-up signal from the outside and starting power supply to a microcomputer to cause starting-up. In addition, before the microcomputer of the electronic control device outputs a stop command to the wake-up circuit during shutdown processing, a stop command is output to the relay switch, whereby an output terminal of the wake-up circuit is diagnosed as being fixed based on an output signal from the wake-up circuit.

Effects of the Invention

According to the present invention, there is provided an electronic control device including a wake-up circuit, in which it is possible to diagnose whether or not a fixed ON or a fixed OFF is generated in the wake-up circuit.

MODE FOR CARRYING OUT THE INVENTION

In the following, an embodiment for carrying out the present invention will be described in detail with reference to the attached drawings.

Figure 1:
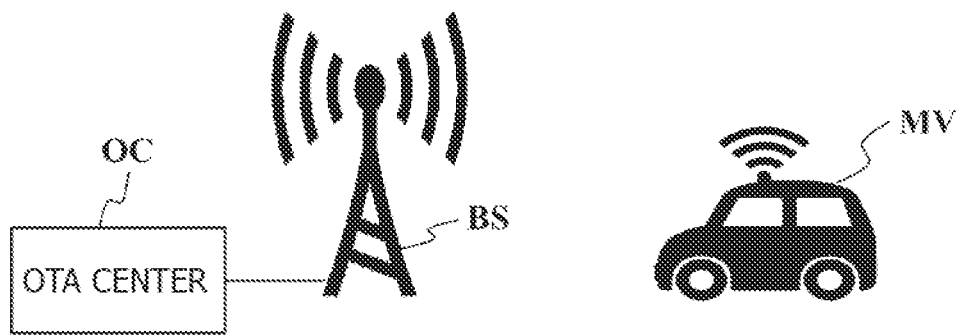
FIG. 1 is a schematic diagram illustrating an example of a data rewriting system.

FIG. 1 illustrates an example of a data rewriting system rewriting an application program of an electronic control device mounted in an automobile MV by utilizing an OTA performing data communication by a wireless network. Here, automobile MV may be a passenger car, a bus, a truck, a construction machine or the like.

Automobile MV is connected to an OTA center OC in which a computer system is installed via a base station BS so as to allow transfer and reception of freely selected data. In the case in which the application program of automobile MV is to be rewritten, the computer system of OTA center OC makes an inquiry, for example, about whether it is possible to rewrite data into automobile MV, and transfers an application program to automobile MV if it is possible to rewrite data.

Figure 2:
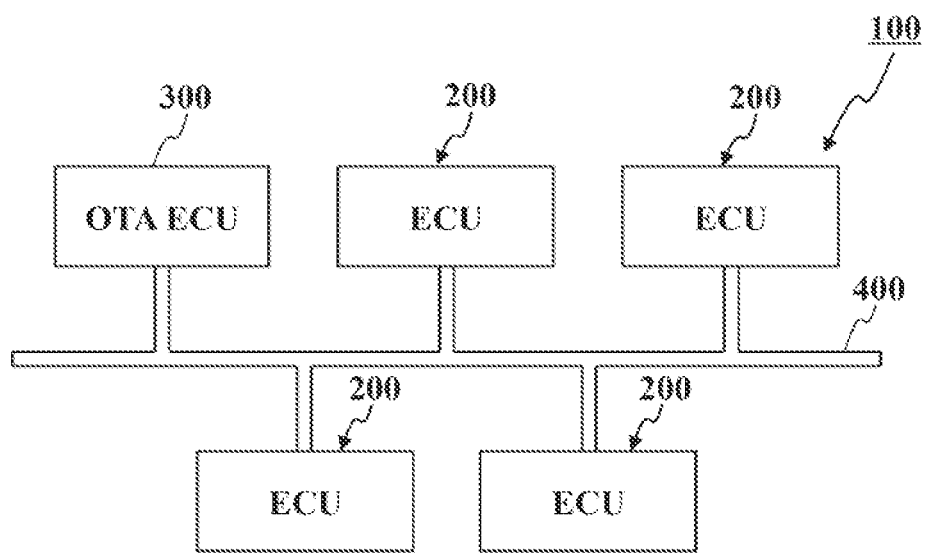
FIG. 2 is a schematic diagram illustrating an example of an electronic control system mounted in an automobile.

As shown in FIG. 2, an electronic control system 100 electronically controlling various apparatuses such as an engine and an automatic transmission is mounted in automobile MV. Electronic control system 100 includes a plurality of electronic control devices (ECU) 200 electronically controlling various apparatuses, an OTA electronic control device 300 intermediating wireless communication with OTA center OC, and a vehicle-mounted network 400 connecting the plurality of electronic control devices 200 and OTA electronic control device 300 so as to allow mutual communication. Here, although in the example shown, electronic control system 100 includes four electronic control devices 200, it may also include a freely selected number of electronic control devices 200. As vehicle-mounted network 400, it is possible to employ a CAN (Control Area Network), FlexRay (registered trademark) or the like. OTA electronic control device 300 constitutes an example of an external apparatus.

Figure 3:
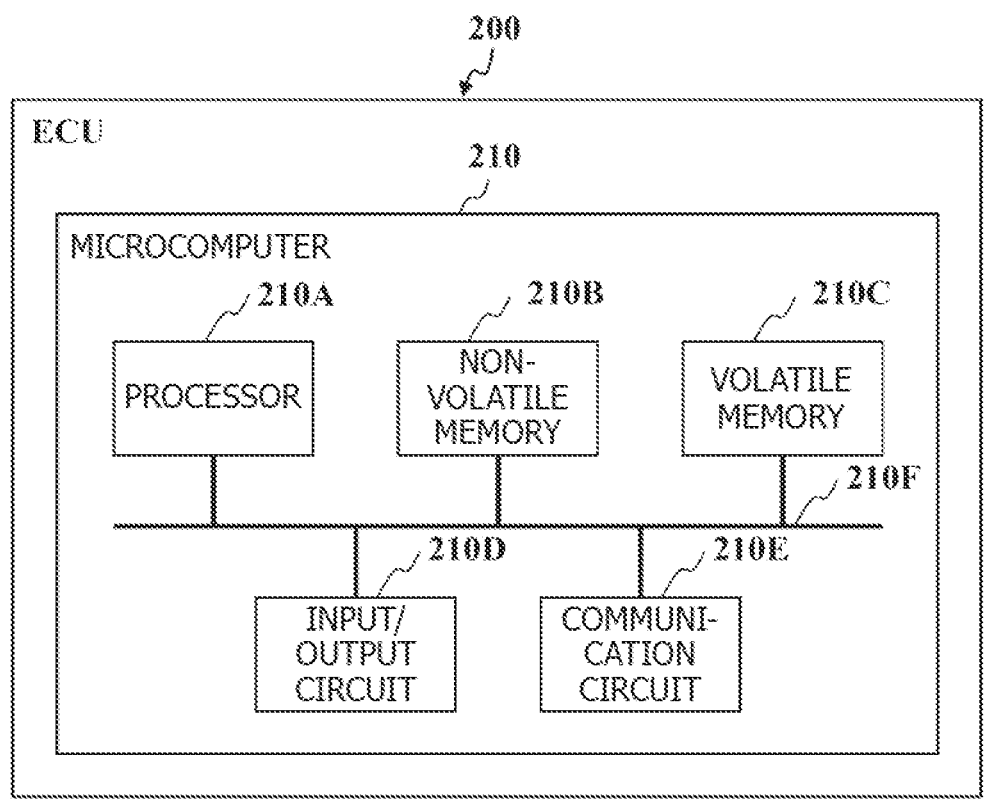
FIG. 3 is a schematic diagram illustrating an example of a microcomputer.

Each electronic control device 200 includes a microcomputer 210, as shown in FIG. 3. Microcomputer 210 contains a processor 210A such as a CPU (Central Processing Unit), a non-volatile memory 210B, a volatile memory 210C, an input and output circuit 210D, a communication circuit 210E, and an internal bus 210F connecting these components so as to allow mutual communication.

Processor 210A is hardware executing a command set (transfer, computation, processing, control, management, etc., of data) described in an application program, and is formed by a computation device, a register storing a command and data, a peripheral circuit, etc. Non-volatile memory 210B consists, for example, of a flash ROM (Read Only Memory) or EEPROM (Electrically Erasable Programmable Read Only Memory) that is capable of retaining data even if power supply is cut off, and retains an application program (computer program) adopted in the present embodiment, a learning value, failure information, etc. Volatile memory 210C consists, for example, of a dynamic RAM (Random Access Memory) involving data loss when power supply is cut off, and provides a storage area for temporarily storing data in the computation process of processor 210A.

Input and output circuit 210D consists, for example, of an A/D converter, a D/A converter, a D/D converter, etc., and provides input and output functions for an analog signal and a digital signal with respect to a sensor, an actuator and the like. Communication circuit 210E consists, for example, of a CAN transceiver, and provides a function by which connection to vehicle-mounted network 400 is caused. Internal bus 210F is a route for exchanging data between devices, and it includes an address bus for transferring addresses, a data bus for transferring data, and a control bus for exchanging control information and the timing at which the input and output is actually caused at the address bus and data bus.

Figure 4:
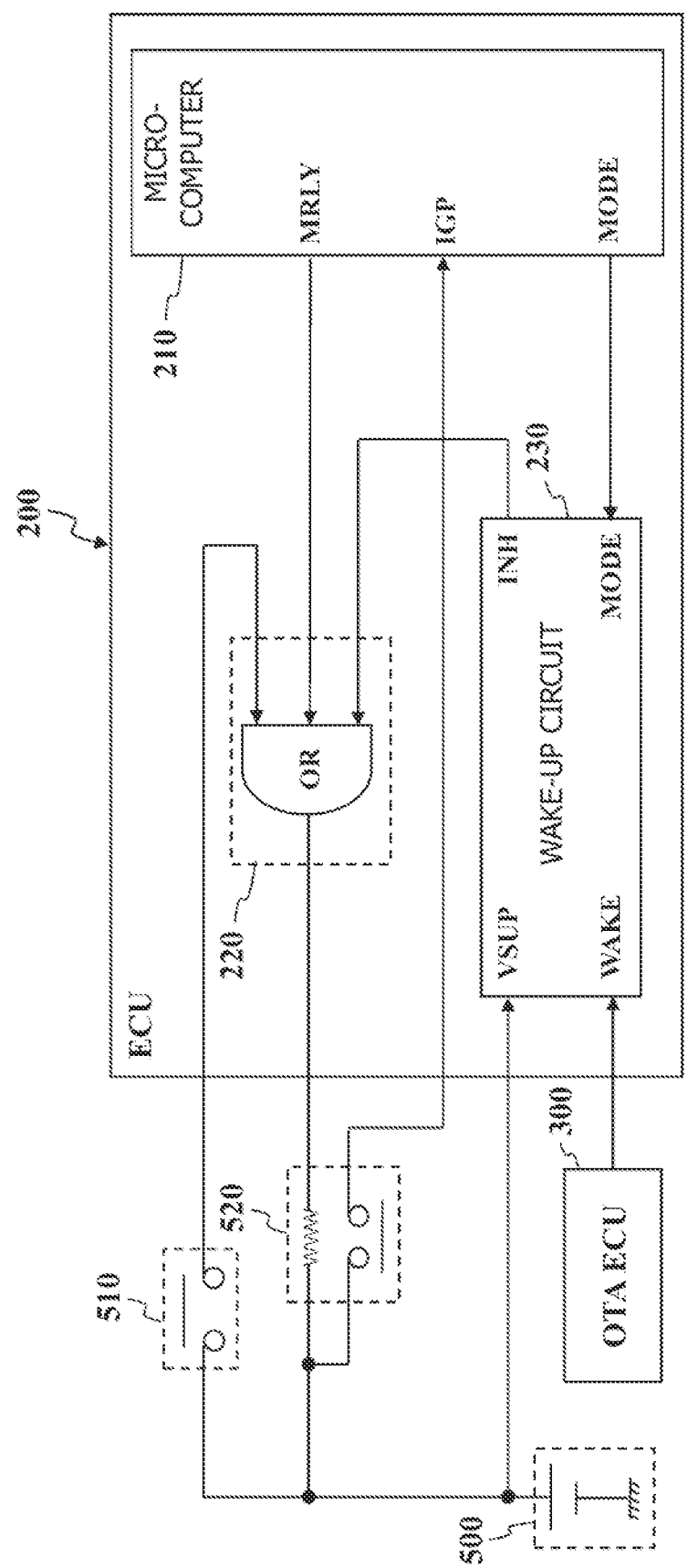
FIG. 4 is a schematic diagram illustrating an example of a basic power supply circuit of a microcomputer.

As shown in FIG. 4, electronic control device 200 further includes a relay switch 220 consisting of a semiconductor device and a wake-up circuit 230 consisting of a semiconductor integrated circuit in addition to microcomputer 210. Relay switch 220 includes three input terminals and one output terminal. In relay switch 220, when an ON signal (HIGH signal) is input at least to one of the three input terminals, an ON signal is output from the output terminal. Wake-up circuit 230 includes a VSUP terminal to which power is supplied, a WAKE terminal to which a wake-up signal is input, an INH terminal to which a start-up signal is output, and a MODE terminal to which a mode is input.

In addition, in the state in which power is supplied to a VSUP terminal, when a wake-up signal is input to a WAKE terminal or a normal mode signal is input to a MODE terminal, wake-up circuit 230 outputs an ON signal (start signal) from an INH terminal. In the state in which a start-up signal is output from the INH terminal, when a sleep-mode signal is input to a MODE terminal, a wake-up circuit 230 outputs an OFF signal from the INH terminal.

As shown in FIG. 4, a battery 500, an ignition switch 510, and a power relay 520 retaining power supply to microcomputer 210 are respectively mounted at predetermined portions of automobile MV. Battery 500 is respectively connected to one contact of ignition switch 510, one coil terminal and contact of power relay 520, and VSUP terminal of wake-up circuit 230. The other contact of ignition switch 510 is connected to one input terminal of relay switch 220. The other coil contact of power relay 520 is connected to the output terminal of relay switch 220. The other contact of power relay 520 is connected to an IGP terminal to which power is supplied in microcomputer 210. The other two input terminals of relay switch 220 are respectively connected to an MRLY terminal outputting a power self-retaining signal in microcomputer 210, and an INH terminal of wake-up circuit 230. The MODE terminal of wake-up circuit 230 is connected to the MODE terminal outputting a mode signal in microcomputer 210.

In the state in which microcomputer 210 is shut down, when there is an inquiry from OTA center OC or an application program rewriting command, OTA electronic control device 300 outputs a wake-up signal to electronic control device 200 to be controlled. More specifically, OTA electronic control device 300 is connected to the WAKE terminal of wake-up circuit 230 of electronic control device 200, and outputs a wake-up signal to the WAKE terminal when microcomputer 210 is to be started up.

First, in order to facilitate understanding of the present embodiment, a method will be described for starting up microcomputer 210, a method for diagnosing an MRLY terminal and an INH terminal, and a problem therein, in a prior-art technique. In the following description, there is assumed a processing of rewriting an application program of electronic control device 200 by utilizing OTA.

Figure 5:
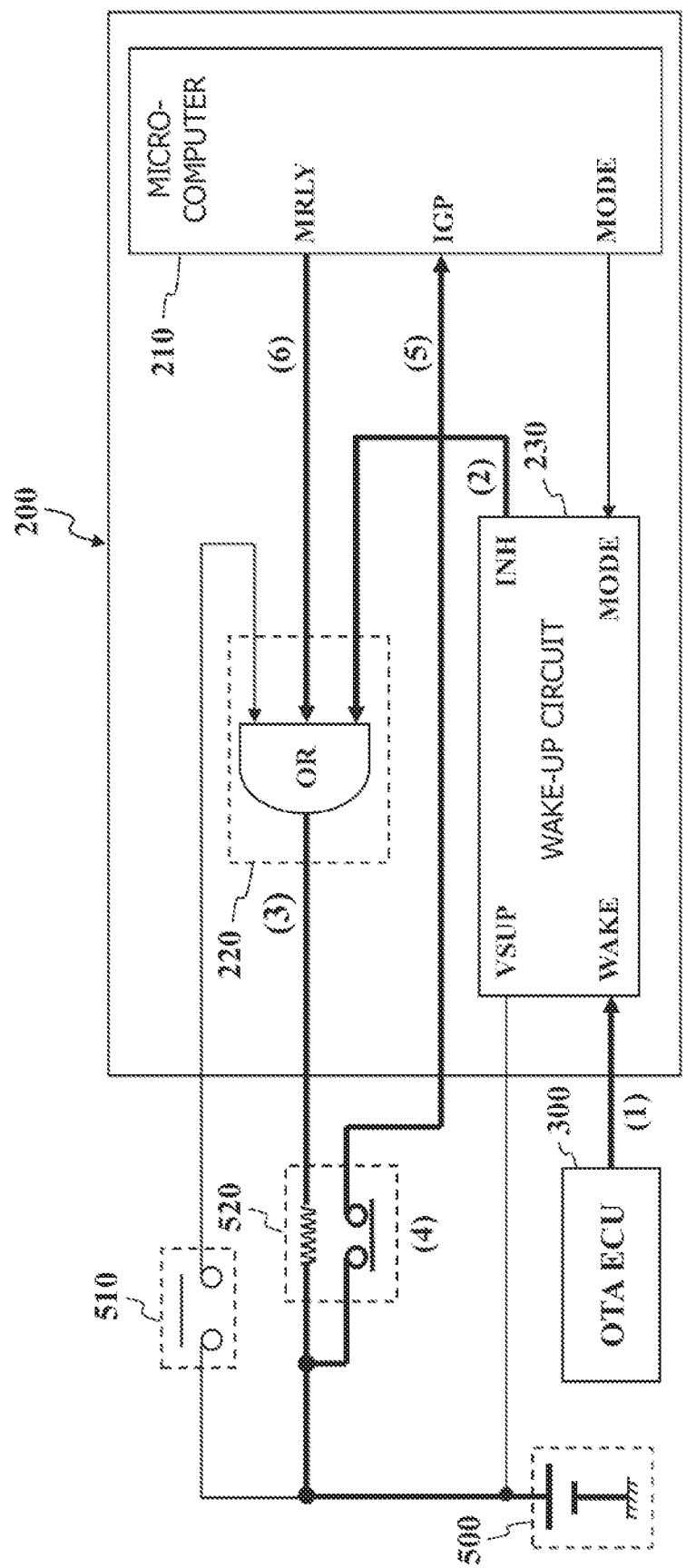
FIG. 5 is an explanatory view illustrating an example of procedures through which a microcomputer is started up by a wake-up signal.

As shown in FIG. 5, when OTA electronic control device 300 receives an application program rewriting command, OTA electronic control device 300 outputs a wake-up signal to the WAKE terminal of wake-up circuit 230 (procedure (1)). Wake-up circuit 230, to which the wake-up signal is input, outputs an ON signal from an INH terminal to relay switch 220 (procedure (2)). Relay switch 220, to which the ON signal is input, outputs an ON signal from the output terminal to the coil terminal of power relay 520 (procedure (3)). In power relay 520 of the coil terminal, to which the ON signal is input, the coil operates to cause inter-contact connection (procedure (4)), and power supply from battery 500 to microcomputer 210 is started (procedure (5)). In addition, when the power supply to microcomputer 210 is started, microcomputer 210 is started up, and outputs an ON signal to relay switch 220 from an MRLY terminal to self-retain power supply (procedure (6)). After this, microcomputer 210 rewrites an application program stored in non-volatile memory 210B.

Figure 6:
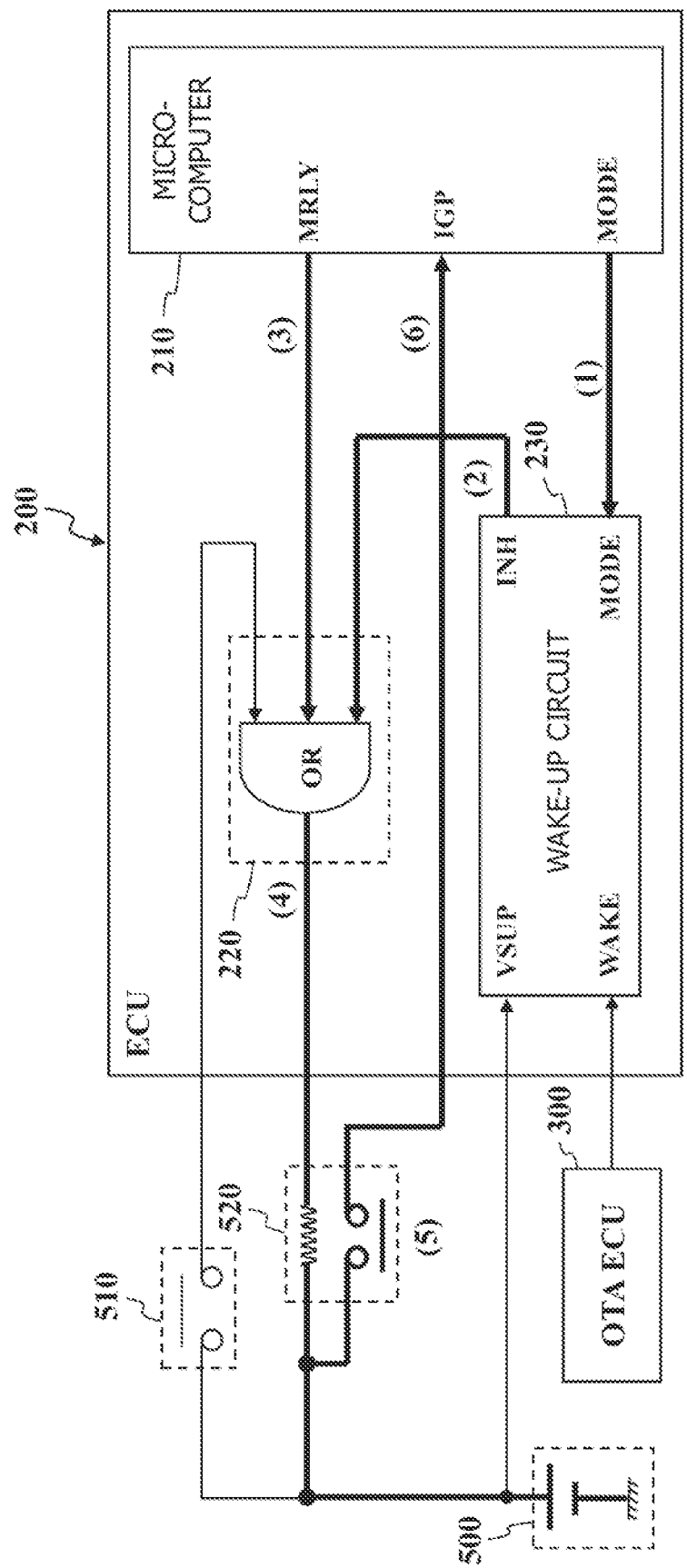
FIG. 6 is an explanatory view illustrating an example of procedures through which a microcomputer is shut down.

As shown in FIG. 6, when the rewriting of the application program is completed, microcomputer 210 outputs a sleep-mode signal to the MODE terminal of wake-up circuit 230 from the MODE terminal to terminate the self-retaining of power (procedure (1)). Wake-up circuit 230, to which the sleep-mode signal is input, outputs an OFF signal to relay switch 220 from the INH terminal (procedure (2)). Microcomputer 210 outputs an OFF signal to relay switch 220 from the MRLY terminal (procedure (3)). Since ignition switch 510 is OFF, an OFF signal is input to all the three input terminals of relay switch 220, and an OFF signal is output to the coil terminal of power relay 520 from the output terminal thereof (procedure (4)). When the OFF signal is input to the coil terminal of power relay 520, power relay 520 stops the operation of the coil to cause inter-contact releasing (procedure (5)), and cuts off the power supply from battery 500 to microcomputer 210 (procedure (6)). When the power supply to microcomputer 210 is cut off, microcomputer 210 is shut down.

Here, before describing the present embodiment in detail, how, in the prior art, fixation of the MRLY terminal of microcomputer 210 and the INH terminal of wake-up circuit 230 is diagnosed will be described.

Figure 7:
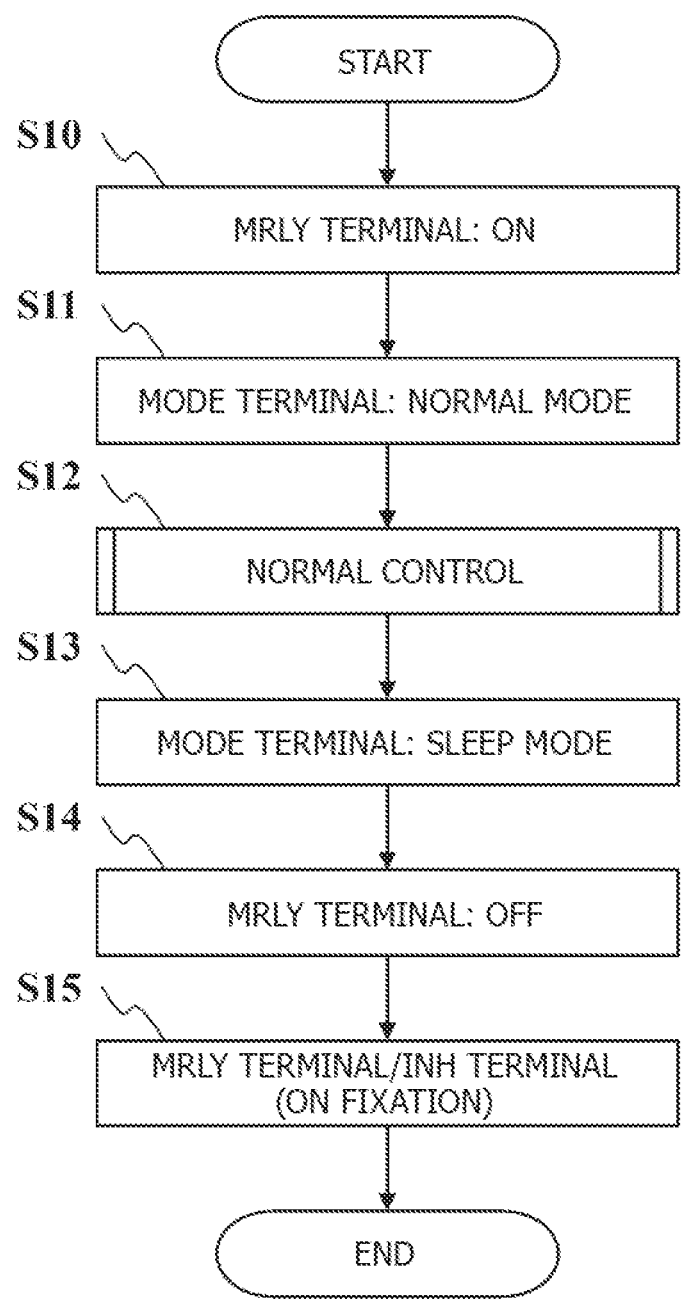
FIG. 7 is a flowchart illustrating an example of a diagnosis processing in a prior-art technique.

FIG. 7 illustrates an example of the control processing of a control object apparatus into which diagnosis processing is incorporated, which is executed by processor 210A of microcomputer 210 upon the operation of ignition switch 510 from OFF to ON. Processor 210A of microcomputer 210 executes the control processing in accordance with an application program stored in non-volatile memory 210B.

In step 10 (shortened to "S10" in FIG. 7; this also applies to the following steps), processor 210A of microcomputer 210 outputs an ON signal to relay switch 220 from the MRLY terminal. Relay switch 220, to which the ON signal is input, outputs an ON signal to the coil terminal of power relay 520 to turn ON power relay 520, self-retaining the power supplied to microcomputer 210 from battery 500.

In step 11, processor 210A of microcomputer 210 outputs a normal mode signal to wake-up circuit 230 from a MODE terminal. Wake-up circuit 230, to which the normal mode signal is input, undergoes transition from a sleep mode to a normal mode, continuing to output an ON signal from an INH terminal.

In step 12, processor 210A of microcomputer 210 repeatedly executes a normal control to control the control object apparatus until ignition switch 510 is operated from ON to OFF. Here, the control object apparatus include an engine and an automatic transmission or the like (This also applies to the following).

In step 13, processor 210A of microcomputer 210 outputs a sleep mode signal to wake-up circuit 230 from the MODE terminal. Wake-up circuit 230, to which the sleep mode signal is input, undergoes transition from the normal mode to the sleep mode, continuing to output an OFF signal from the INH terminal.

In step 14, processor 210A of microcomputer 210 outputs an OFF signal to relay switch 220 from the MRLY terminal. If no fixed ON is generated at the MRLY terminal and the INH terminal, an OFF signal is input to the three input terminals of relay switch 220 to which the OFF signal is input, and thus, relay switch 220 outputs an OFF signal to power relay 520 to turn OFF power relay 520.

In step 15, processor 210A of microcomputer 210 diagnoses that a fixed ON is generated in at least one of the MRLY terminal and the INH terminal. After this, processor 210A of microcomputer 210 terminates the control processing.

In the control processing into which such diagnosis processing is incorporated, even if an attempt is made to cut off the power supply to microcomputer 210, so long as microcomputer 210 continues its operation, diagnosis is made to the effect that a fixed ON is generated at the MRLY terminal of microcomputer 210 or the INH terminal of wake-up circuit 230 based on the recognition that relay switch 220 could not be turned OFF. However, in the prior-art technique, it is impossible to specify which of the MRLY terminal and the INH terminal has undergone a fixed ON, and a fixed OFF of the INH terminal cannot be diagnosed.

Figure 8:
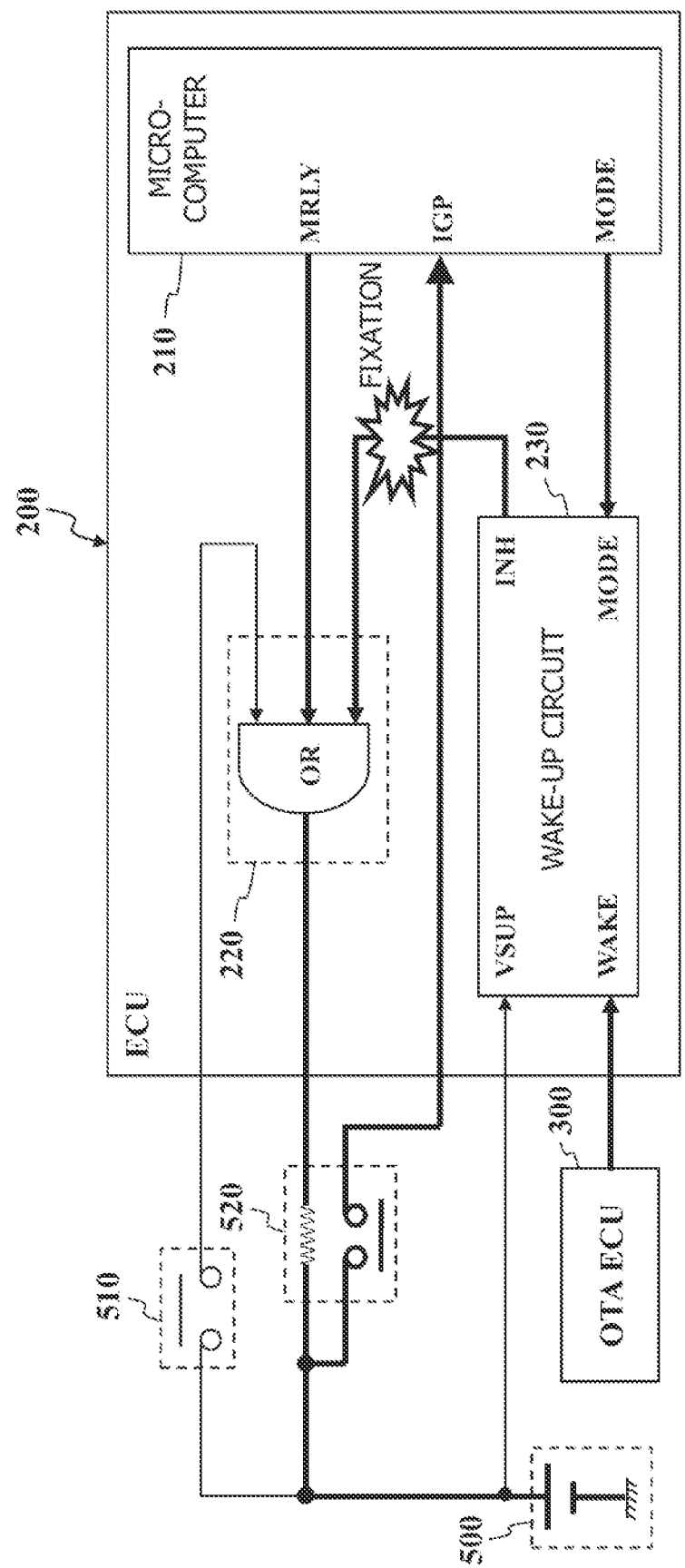
FIG. 8 is an explanatory view illustrating a problem in the prior-art technique.

In addition, as shown in FIG. 8, when the fixed ON or the fixed OFF is generated at the INH terminal of wake-up circuit 230, the following problems may occur. That is, when the fixed ON is generated at the INH terminal, it becomes impossible to turn OFF relay switch 220 in the shutdown processing, making it impossible to shut down microcomputer 210. In addition, when microcomputer 210 cannot be shut down, battery 500 is consumed due to an increase in dark current, and it becomes impossible to restart the engine of automobile MV. When a fixed OFF is generated at the INH terminal, microcomputer 210 cannot be started up even if a wake-up signal is received from OTA electronic control device 300, and it becomes impossible to rewrite the application program. A fixed ON and a fixed OFF at the INH terminal are generated due, for example, to failure of wake-up circuit 230, failure of the line of the MODE terminal or the INH terminal, etc.

Next, a plurality of embodiments in which the problems mentioned above is eliminated will be described.

Figure 9:
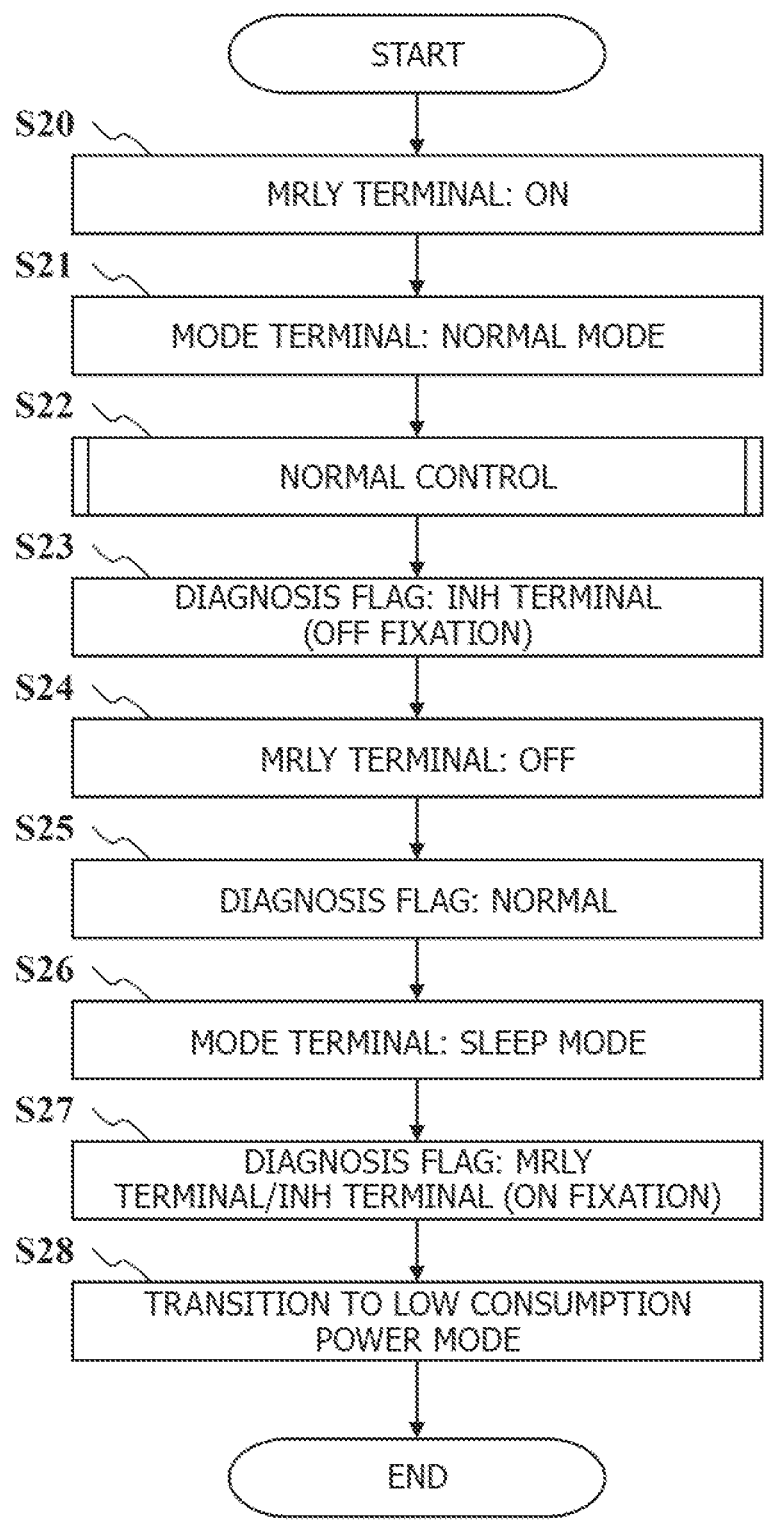
FIG. 9 is a flowchart illustrating a first example of diagnosis processing.

In the case of the circuit shown in FIG. 4, FIG. 9 shows an example of the control processing for a control object apparatus into which there is incorporated a first diagnosis processing executed by processor 210A of microcomputer 210 upon the operation of turning the ignition switch 510 from OFF to ON. Processor 210A of microcomputer 210 executes control processing into which the first diagnosis processing is incorporated in accordance with an application program stored in non-volatile memory 210B.

In step 20, processor 210A of microcomputer 210 outputs an ON signal from the MRLY terminal to relay switch 220. Relay switch 220, to which the ON signal is input, outputs an ON signal from the output terminal thereof to the coil terminal of power relay 520 to turn ON power relay 520, self-retaining the power supply from battery 500 to microcomputer 210.

In step 21, processor 210A of microcomputer 210 outputs a normal mode signal to wake-up circuit 230 from MODE terminal. Wake-up circuit 230 to which the normal mode signal is input undergoes transition from the sleep mode to the normal mode, continuing to output an ON signal to relay switch 220 from the INH terminal.

In step 22, processor 210A of microcomputer 210 repeatedly executes normal control to control the control object apparatus until ignition switch 510 is operated from ON to OFF.

In step 23, processor 210A of microcomputer 210 sets a diagnosis flag stored in non-volatile memory 210B to a value making it possible to identify generation of a fixed OFF at the INH terminal of wake-up circuit 230.

In step 24, processor 210A of microcomputer 210 outputs an OFF signal to relay switch 220 from the MRLY terminal.

In step 25, processor 210A of microcomputer 210 sets a diagnosis flag of non-volatile memory 210B to a value making it possible to determine that the MRLY terminal and the INH terminal are normal.

In step 26, processor 210A of microcomputer 210 outputs a sleep mode signal to wake-up circuit 230 from the MODE terminal. Wake-up circuit 230, to which the sleep mode signal is input, undergoes transition from a normal mode to a sleep mode, continuing to output an OFF signal to relay switch 220 from the INH terminal. Thus, if no fixed ON is generated at the MRLY terminal and the INH terminal, an OFF signal is input to the three input terminals of relay switch 220, and an OFF signal is output to power relay 520 from the output terminal thereof to turn OFF power relay 520.

In step 27, processor 210A of microcomputer 210 sets the diagnosis flag of non-volatile memory 210B to a value making it possible to determine that a fixed ON is generated at the MRLY terminal or the INH terminal.

In step 28, processor 210A of microcomputer 210 undergoes transition to a low power consumption mode in which power consumption is reduced. After this, processor 210A of microcomputer 210 terminates the control processing to which the first diagnosis processing is incorporated. Here, the low power consumption mode may, for example, be a mode in which the clock frequency at which microcomputer 210 is operated is changed, or a mode in which it is switched to a fail-safe mode in which there is a limitation in terms of function.

According to the control processing into which the first diagnosis processing is incorporated, in the shutdown processing of microcomputer 210, the diagnosis flag stored in non-volatile memory 210B is set to a value making it possible to determine that a fixed OFF is generated at the INH terminal, and after this, an OFF signal is output to relay switch 220 from microcomputer 210. At this time, if a fixed OFF is generated at the INH terminal, an OFF signal is input to the three input terminals of relay switch 220, and relay switch 220 is turned OFF to turn OFF power relay 520. In addition, when power relay 520 is turned OFF, the power supply to microcomputer 210 from battery 500 is cut off, and microcomputer 210 is shut down. The diagnosis flag, which is stored in non-volatile memory 210B, remains set to a value indicating generation of a fixed OFF at the INH terminal, so that, for example, by reading this when microcomputer 210 is restarted, it is possible to diagnose the generation of a fixed OFF at the INH terminal.

If no fixed OFF is generated at the INH terminal, an ON signal is output to relay switch 220 from the INH terminal of wake-up circuit 230, even if an OFF signal is output to relay switch 220 from microcomputer 210, so that relay switch 220 remains ON, and microcomputer 210 continues its operation.

In addition, after the diagnosis flag is set to a value indicating that the MRLY terminal and the INH terminal are normal, a sleep mode signal is output to wake-up circuit 230 from microcomputer 210. Wake-up circuit 230, to which the sleep mode signal is input, undergoes transition from the normal mode to the sleep mode, and outputs an OFF signal to relay switch 220 from the INH terminal. At this time, if the MRLY terminal and the INH terminal are normal, an OFF signal is output to the three input terminals of relay switch 220, and with the diagnosis flag being set to a value making it possible to determine that the MRLY terminal and the INH terminal are normal, microcomputer 210 is shut down. Thus, this is read when microcomputer 210 is restarted, whereby it is possible to diagnose that the MRLY terminal and the INH terminal are normal state.

On the other hand, if a fixed ON is generated in at least one of the MRLY terminal and the INH terminal, an ON signal continues to be input to at least one of the three input terminals of relay switch 220, so that it is not turned OFF when an OFF signal is output to power relay 520, and the operation of microcomputer 210 is continued. In this case, the diagnosis flag is set to a value making it possible to identify generation of fixation in at least one of the MRLY terminal and the INH terminal, and then, transition is caused to a low power consumption mode in order to reduce the dark current attributable to the impossibility of shutting down microcomputer 210.

Thus, a diagnosis tool is connected, for example, to vehicle-mounted network 400, and the diagnosis flag is read from non-volatile memory 210B, whereby it is possible to diagnose generation of a fixed ON in at least one of the MRLY terminal and the INH terminal. If a fixed ON is generated in at least one of the MRLY terminal and the INH terminal, transition to the low power consumption mode is caused, so that it is possible to suppress the consumption of battery 500 attributable to an increase in dark current.

Thus, in the control processing into which the first diagnosis processing is incorporated, before microcomputer 210 outputs a stop command to wake-up circuit 230 during shutdown processing, a stop command is output to relay switch 220, whereby it is possible to diagnose fixation at the output terminal based on an output signal from wake-up circuit 230. Thus, not only the fixation at least at one of the MRLY terminal and the INH terminal, but also a fixed OFF at the INH terminal can be diagnosed. In addition, through adequate inspection and repair of electronic control device 200, it is possible to eliminate the undesirable situation in which microcomputer 210 does not start up even when there is a wake-up signal.

Figure 10:
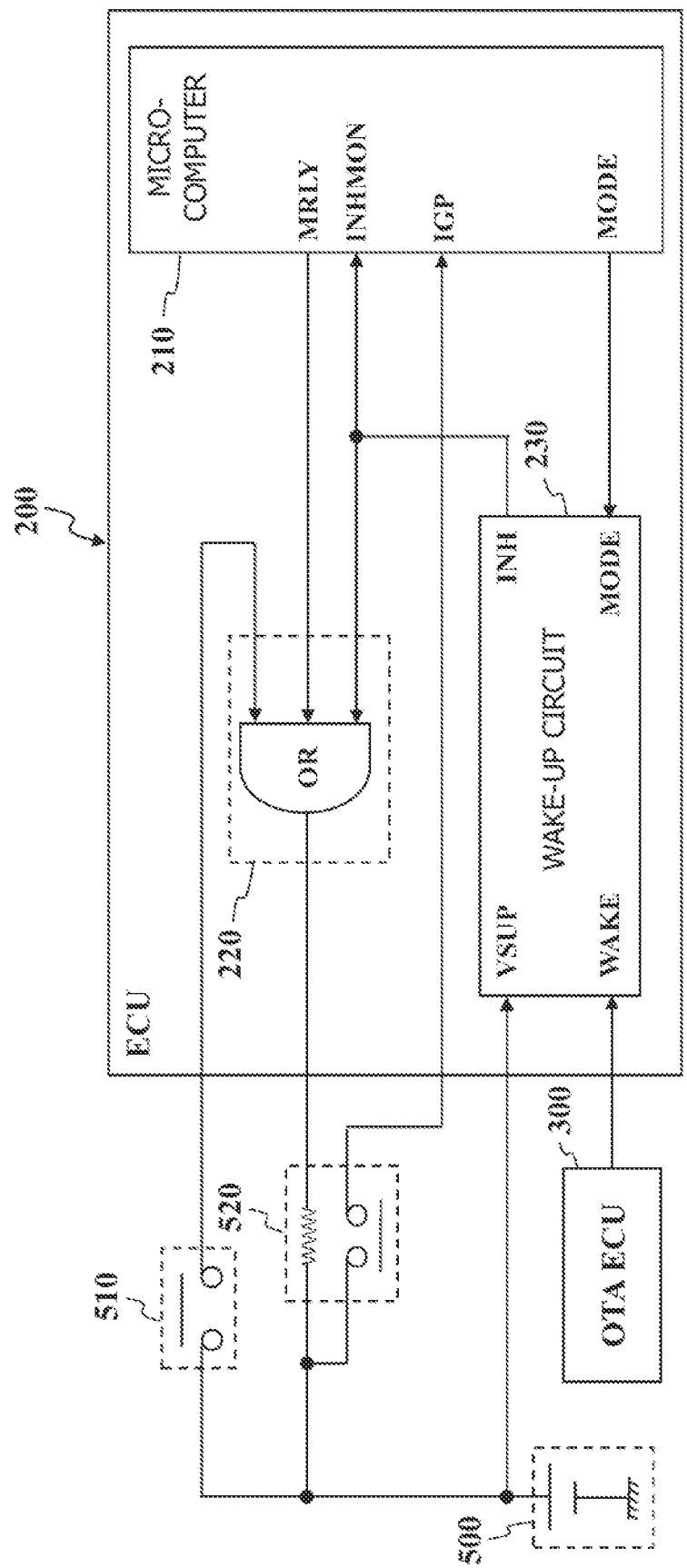
FIG. 10 is a schematic diagram illustrating a first modification of a power supply circuit of a microcomputer.

As shown in FIG. 10, it is also possible to further incorporate into the circuit for starting up microcomputer 210 a circuit connecting the INH terminal of wake-up circuit 230 and the INHMON terminal of microcomputer 210, that is, a monitor circuit monitoring a signal output from the INH terminal. By doing so, it is possible for microcomputer 210 to detect what kind of signal is output from the INH terminal of wake-up circuit 230.

Figure 11:
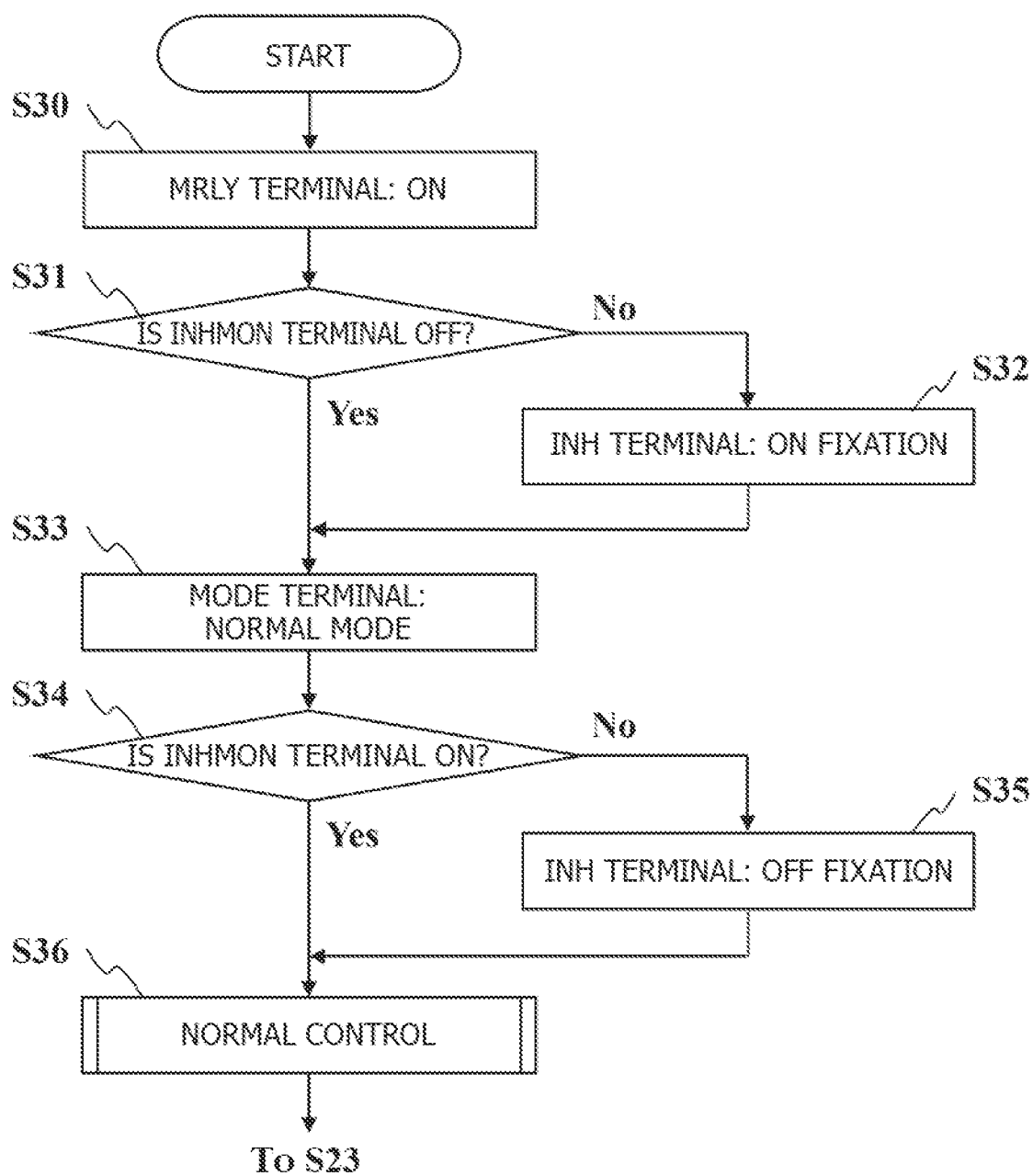
FIG. 11 is a flowchart illustrating a second example of diagnosis processing.

In the case of the circuit shown in FIG. 10, FIG. 11 shows an example of control processing for a control object apparatus into which there is incorporated a second diagnosis processing executed by processor 210A of microcomputer 210 upon the operation of ignition switch 510 from OFF to ON. Processor 210A of microcomputer 210 executes the control processing into which the second diagnosis processing is incorporated in accordance with an application program stored in non-volatile memory 210B.

In step 30, processor 210A of microcomputer 210 outputs an ON signal to relay switch 220 from the MRLY terminal. Relay switch 220, to which the ON signal is input, outputs an ON signal to power relay 520 from the output terminal to turn ON power relay 520, self-retaining the power supply to microcomputer 210 from battery 500.

In step 31, processor 210A of microcomputer 210 determines whether or not an OFF signal is input to the INHMON terminal, that is, whether or not an OFF signal is output from the INH terminal of wake-up circuit 230. In addition, if an OFF signal is input to the INHMON terminal (Yes), processor 210A of microcomputer 210 advances the procedure to step 33. On the other hand, if processor 210A of microcomputer 210 determines that no OFF signal is input to the INHMON terminal, that is, that an ON signal is input to the INHMON terminal (No), the procedure advances to step 32.

In step 32, processor 210A of microcomputer 210 diagnoses to the effect that a fixed ON is generated at the INH terminal. When a fixed ON occurs at the INH terminal, processor 210A of microcomputer 210 may record the diagnosis result on the diagnosis flag of non-volatile memory 210B, and notify the diagnosis result through the operation of a display device, a sound device or the like (not shown) (This also applies to the following). After this, processor 210A of microcomputer 210 advances the procedure to step 33. Here, a display device, a sound device or the like constitutes an example of a notification device.

In step 33, processor 210A of microcomputer 210 outputs a normal mode signal to wake-up circuit 230 from the MODE terminal. Wake-up circuit 230, to which the normal mode signal is input, undergoes transition from a sleep mode to a normal mode, and continues to output an ON signal from the INH terminal.

In step 34, processor 210A of microcomputer 210 determines whether or not an ON signal is input to the INHMON terminal. In addition, when processor 210A of microcomputer 210 determines that an ON signal is input to the INHMON terminal (Yes), the procedure advances to step 36. On the other hand, when processor 210A of microcomputer 210 determines that no ON signal is input to the INHMON terminal, that is, that an OFF signal is input to the INHMON terminal (No), the procedure advances to step 35.

In step 35, processor 210A of microcomputer 210 diagnoses to the effect that a fixed OFF is generated at the INH terminal. After this, processor 210A of microcomputer 210 advances the procedure to step 36.

In step 36, processor 210A of microcomputer 210 repeatedly executes normal control to control the control object apparatus until ignition switch 510 is operated from ON to OFF. After this, processor 210A of microcomputer 210 advances the procedure to step 23 shown in FIG. 9, and executes shutdown processing. The procedures from step 23 onward is already described in the above, so description thereof will be omitted. If necessary, the foregoing description is to be referred to (This also applies to the following).

According to the control processing into which the second diagnosis processing is incorporated, in addition to the effects and advantages of the first diagnosis processing, in the initialization processing in which microcomputer 210 is started up, it is determined what kind of signal is output from the INH terminal of wake-up circuit 230 in accordance with an operation command with respect to relay switch 220 and wake-up circuit 230, making it possible to determine which of fixed ON and fixed OFF occurs at the INH terminal. That is, immediately after the self-retaining of the power supply from battery 500 to microcomputer 210, if fixed ON is not generated at the INH terminal of wake-up circuit 230, wake-up circuit 230 is in a sleep state, so that an OFF signal is output from the INH terminal. Based on this recognition, if an ON signal is output from the INH terminal immediately after the self-retaining of the power supply to microcomputer 210 from battery 500, it is possible to diagnose that a fixed ON is generated at the INH terminal.

When wake-up circuit 230 is caused to undergo transition from the sleep mode to the normal mode, an ON signal is output from the INH terminal if a fixed OFF is not generated at the INH terminal. Based on this recognition, even if wake-up circuit 230 is caused to undergo transition from the sleep mode to the normal mode, so long as an OFF signal is output from the INH terminal, it is possible to diagnose that a fixed OFF is generated at the INH terminal. In brief, in the initialization processing in which microcomputer 210 is started up, it is possible to determine which of a fixed ON and a fixed OFF is generated at the output terminal of wake-up circuit 230 based on whether or not wake-up circuit 230 has output a signal in conformity with an operation command with respect to relay switch 220 and wake-up circuit 230.

Figure 12:
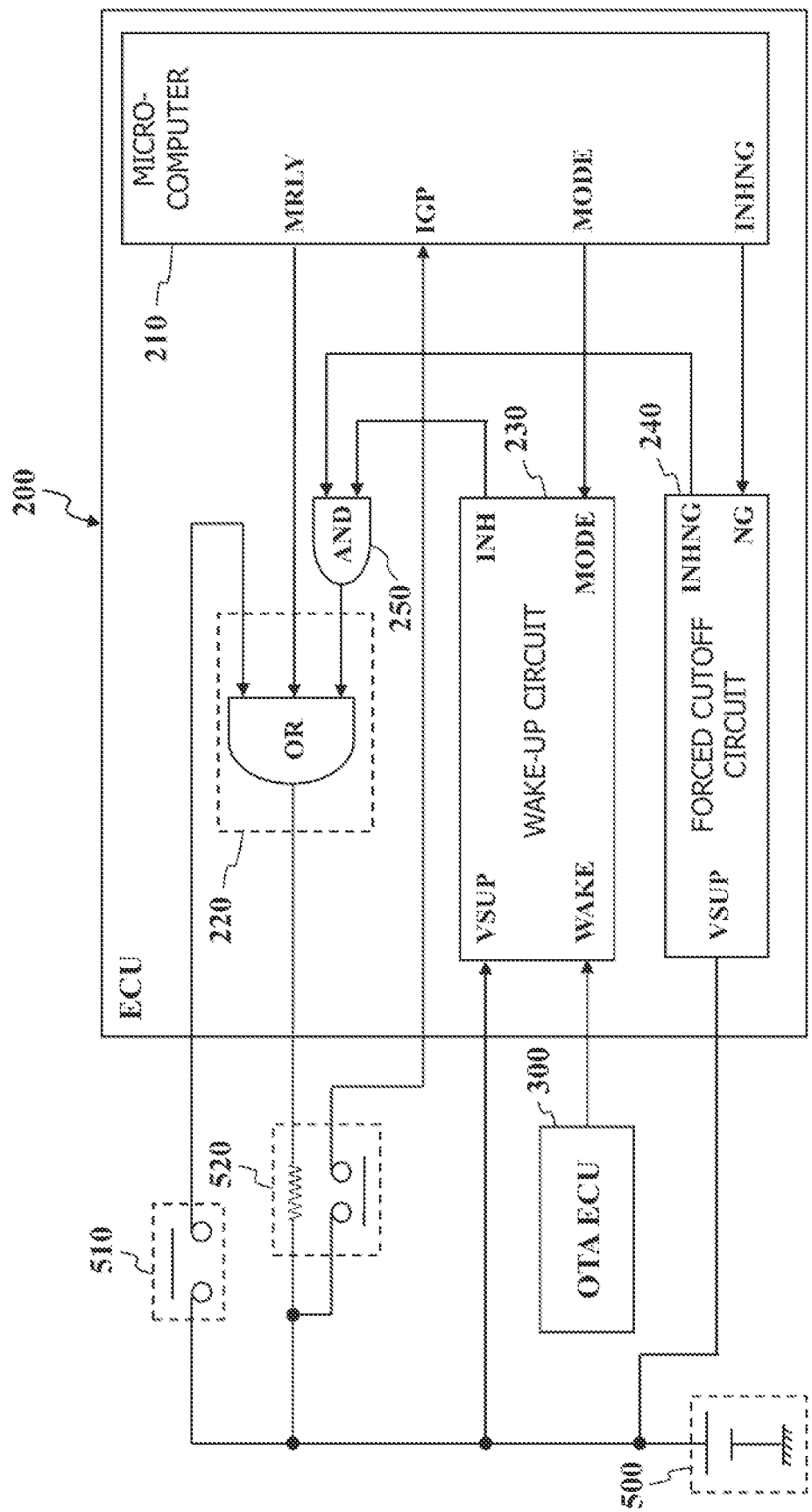
FIG. 12 is a schematic diagram illustrating a second modification of a power supply circuit of a microcomputer.

FIG. 12 shows an example of another circuit starting up microcomputer 210.

In addition to the circuit configuration shown in FIG. 4, electronic control device 200 further includes a forced cutoff circuit 240 and an AND circuit 250.

Forced cutoff circuit 240 includes a VSUP terminal to which power is supplied, an INHNG terminal, and an NG terminal. In addition, in the state in which power is being supplied to VSUP terminal, when an ON signal is input to the NG terminal, forced cutoff circuit 240 outputs an OFF signal from the INHNG terminal, and when an OFF signal is input to the NG terminal, outputs an ON signal from the INHNG terminal. An AND circuit 250 includes two input terminals and one output terminal; when an ON signal is input to both of the two input terminals, it outputs an ON signal from the output terminal thereof, and when an ON signal is not input to both of the two input terminals, it outputs an OFF signal from the output terminal thereof.

One input terminal of AND circuit 250 is connected to the INH terminal of wake-up circuit 230, and the other input terminal of AND circuit 250 is connected to the INHNG terminal of forced cutoff circuit 240. The output terminal of AND circuit 250 is connected to one input terminal of relay switch 220. Furthermore, a VSUP terminal of forced cutoff circuit 240 is connected to battery 500, and the NG terminal of forced cutoff circuit 240 is connected to the INHNG terminal outputting a signal forcefully turning OFF power relay 520 in microcomputer 210.

Thus, even when, in the shutdown processing for microcomputer 210, a fixed ON is generated at the INH terminal of wake-up circuit 230, forced cutoff circuit 240 outputs an OFF signal to AND circuit 250, whereby it is possible to forcefully turn OFF power relay 520 via relay switch 220.

Figure 13:
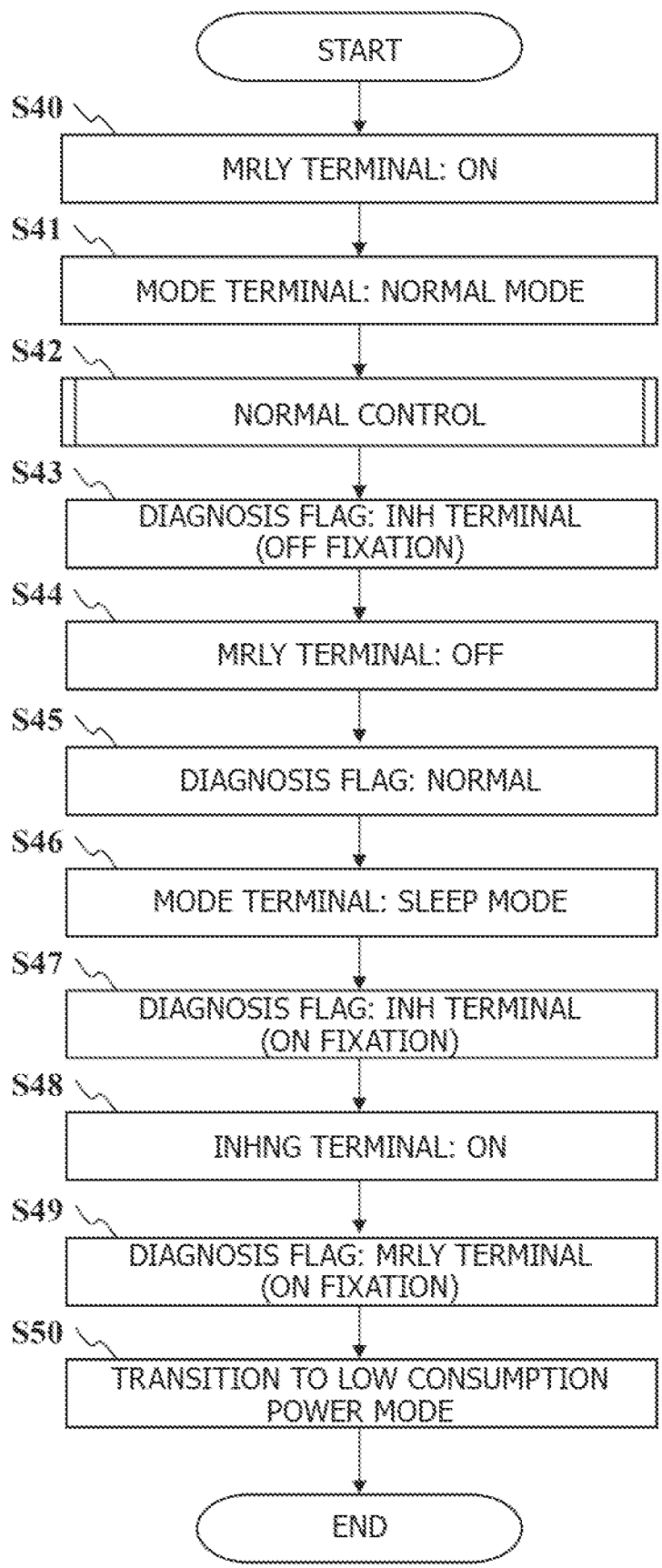
FIG. 13 is a flowchart illustrating a third example of diagnosis processing.

In the case of the circuit shown in FIG. 12, FIG. 13 shows an example of a control processing for a control object apparatus into which a third diagnosis processing is incorporated executed by processor 210A of microcomputer 210 upon the operation of ignition switch 510 from OFF to ON. Processor 210A of microcomputer 210 executes the control processing into which the third diagnosis processing is incorporated in accordance with an application program stored in non-volatile memory 210B.

In step 40, processor 210A of microcomputer 210 outputs an ON signal to relay switch 220 from the MRLY terminal. Relay switch 220 to which the ON signal is input turns ON power relay 520 to thereby self-retain the power supply to microcomputer 210 from battery 500.

In step 41, processor 210A of microcomputer 210 outputs a normal mode signal to wake-up circuit 230 from the MODE terminal. Wake-up circuit 230 to which the normal mode signal is input undergoes transition from the sleep mode to the normal mode, and continues to output an ON signal to relay switch 220 from the INH terminal.

In step 42, processor 210A of microcomputer 210 repeatedly executes normal control to control the control object apparatus until ignition switch 510 is operated to turn from ON to OFF.

In step 43, processor 210A of microcomputer 210 sets the diagnosis flag of non-volatile memory 210B to a value making it possible to identify generation of a fixed OFF at the INH terminal.

In step 44, processor 210A of microcomputer 210 outputs an OFF signal to relay switch 220 from the MRLY terminal.

In step 45, processor 210A of microcomputer 210 sets the diagnosis flag of non-volatile memory 210B to a value making it possible to identify the normal state of the MRLY terminal and the INH terminal.

In step 46, processor 210A of microcomputer 210 outputs a sleep mode signal to wake-up circuit 230 from the MODE terminal. Wake-up circuit 230, to which the sleep mode signal is input, undergoes transition from the normal mode to the sleep mode, and outputs an OFF signal to AND circuit 250 from the INH terminal if no fixed ON is generated at the INH terminal.

In step 47, processor 210A of microcomputer 210 sets the diagnosis flag of non-volatile memory 210B to a value making it possible to identify generation of a fixed ON at the INH terminal.

In step 48, processor 210A of microcomputer 210 outputs an ON signal to forced cutoff circuit 240 from the INHNG terminal. Forced cutoff circuit 240, to which the ON signal is input, outputs an OFF signal to AND circuit 250 from the INHNG terminal.

In step 49, processor 210A of microcomputer 210 sets the diagnosis flag of non-volatile memory 210B to a value making it possible to identify generation of a fixed ON at the MRLY terminal.

In step 50, processor 210A of microcomputer 210 undergoes transition to a low power consumption mode in which the power consumption is reduced. After this, processor 210A of microcomputer 210 terminates the control processing into which the third diagnosis processing is incorporated.

According to the control processing into which the third diagnosis processing is incorporated, in addition to the effects and advantages of the first and second diagnosis processing, in the case in which diagnosis is made to the effect that a fixed ON is generated at the INH terminal of wake-up circuit 230, an OFF signal is output to AND circuit 250 from forced cutoff circuit 240. When an OFF signal is output to AND circuit 250, the condition under which an ON signal is input to both of the two input terminals ceases to be true, and an OFF signal is output to relay switch 220 from the output terminal thereof. At this time, ignition switch 510 is OFF, and an OFF signal is output from the MRLY terminal, so that an OFF signal is input to the three input terminals of relay switch 220, and an OFF signal is output to power relay 520 from the output terminal thereof.

Thus, if no fixed ON is generated at the MRLY terminal of microcomputer 210, power relay 520 is forced to turn OFF, and the power supply to microcomputer 210 from battery 500 is cut off, making it possible to shut down microcomputer 210.

Even if an attempt is made to forcefully turn OFF power relay 520 via relay switch 220 by forced cutoff circuit 240, so long as microcomputer 210 continues its operation, there is a fixed ON at the MRLY terminal, and it is possible to determine that no OFF signal is input to the three input terminals of relay switch 220. Based on this recognition, it is possible to diagnose that a fixed ON is generated at the MRLY terminal.

Figure 14:
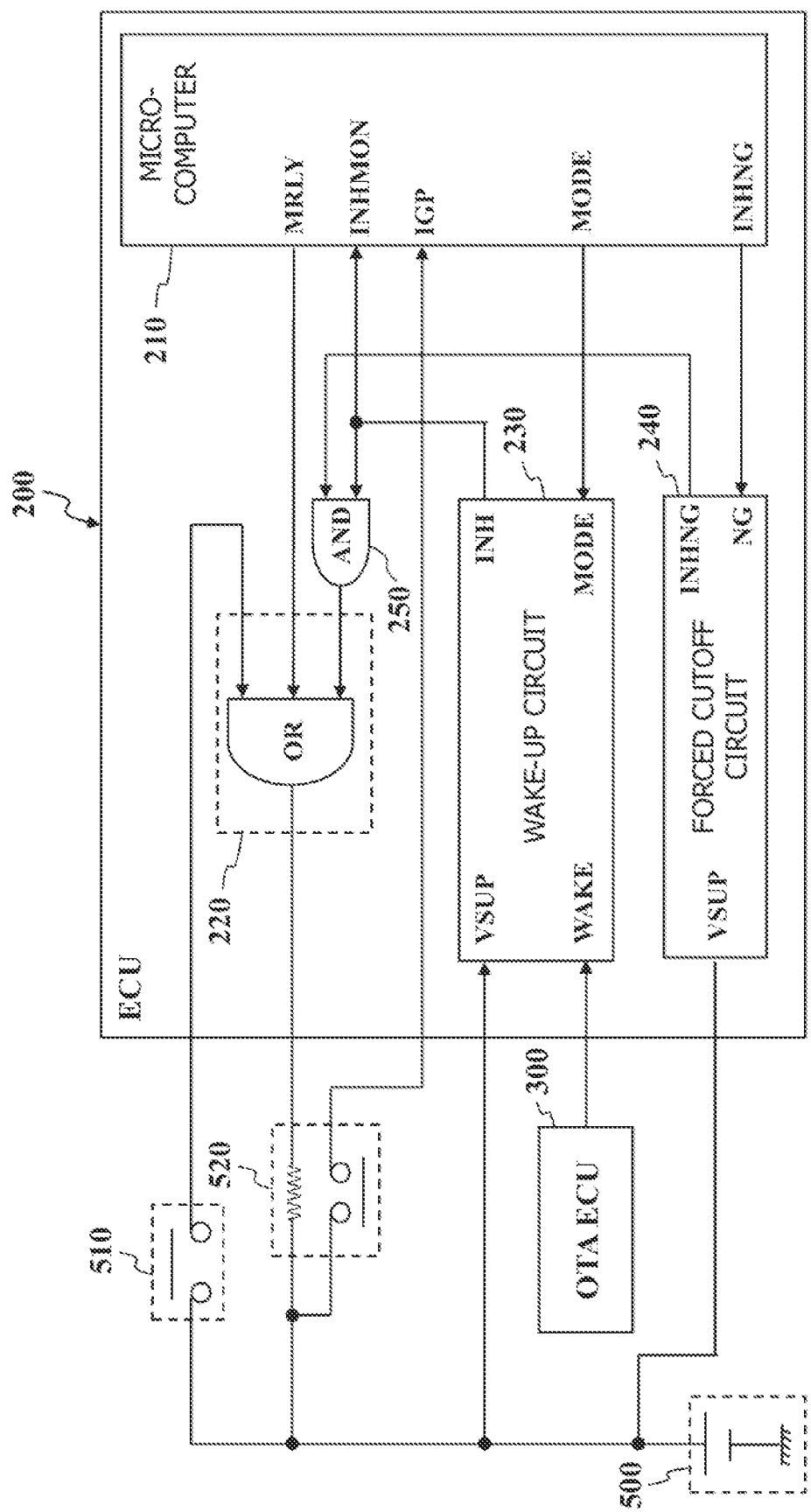
FIG. 14 is a schematic diagram illustrating a third modification of a power supply circuit of a microcomputer.

As shown in FIG. 14, the circuit starting up microcomputer 210 allows further incorporation of a circuit connecting the INH terminal of wake-up circuit 230 and the INHMON terminal of microcomputer 210, that is, a monitor circuit monitoring a signal output from the INH terminal. This makes it possible for microcomputer 210 to detect what kind of signal is output from the INH terminal of wake-up circuit 230.

Figure 15:
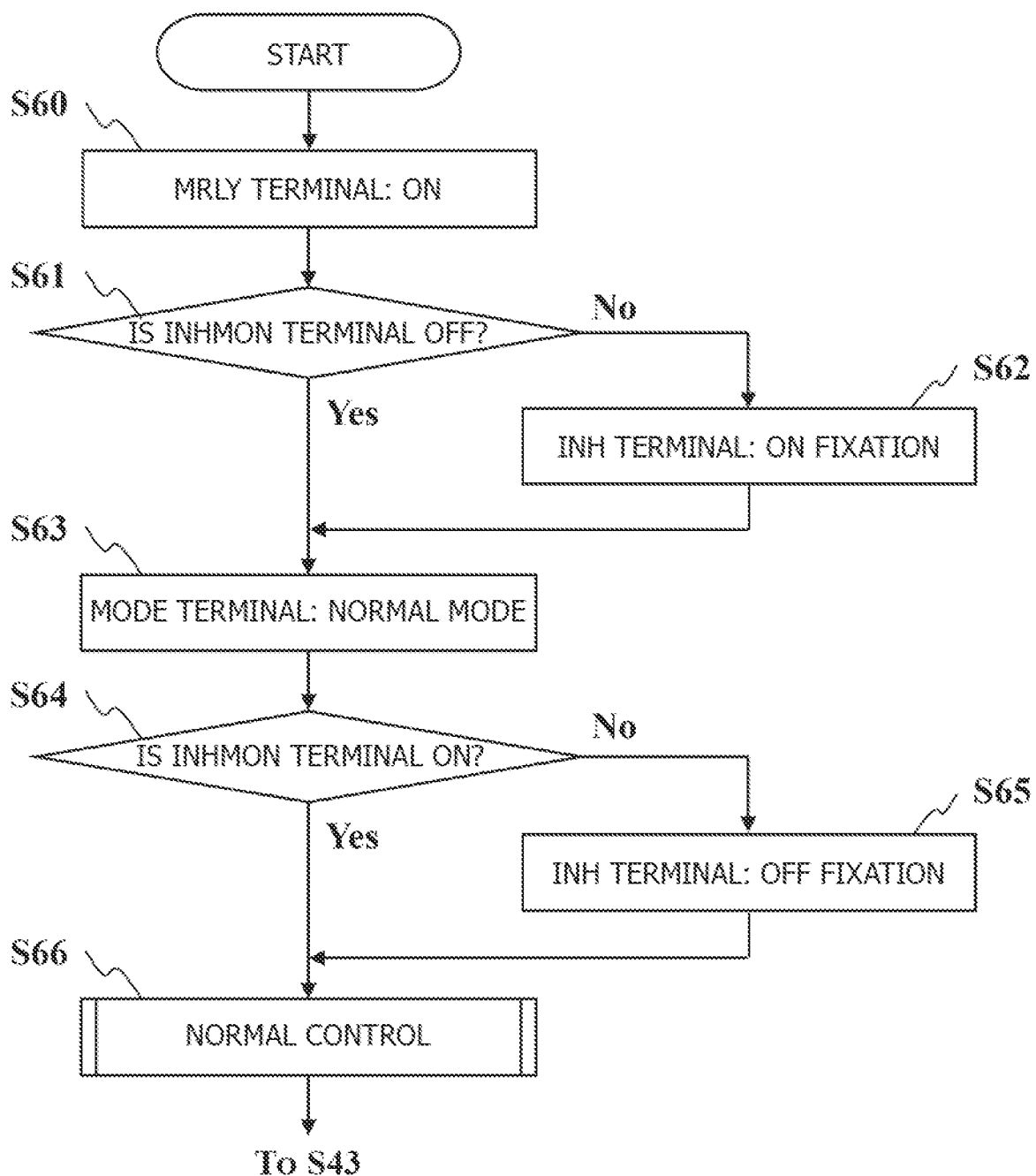
FIG. 15 is a flowchart illustrating a fourth example of diagnosis processing.

In the case of the circuit shown in FIG. 14, FIG. 15 shows an example of control processing into which there is incorporated a fourth diagnosis processing executed by processor 210A of microcomputer 210 upon the operation of ignition switch 510 from OFF to ON. Processor 210A of microcomputer 210 executes the control processing into which the fourth diagnosis processing is incorporated in accordance with an application program stored in non-volatile memory 210B.

In step 60, processor 210A of microcomputer 210 outputs an ON signal to relay switch 220 from the MRLY terminal. Relay switch 220 to which the ON signal is input outputs an ON signal to power relay 520 from the output terminal to turn ON power relay 520, self-retaining the power supply to microcomputer 210 from battery 500.

In step 61, processor 210A of microcomputer 210 determines whether or not an OFF signal is input to the INHMON terminal. In addition, when it determines that an OFF signal is input to the INHMON terminal (Yes), processor 210A of microcomputer 210 advances the procedure to step 63. On the other hand, when it determines that no OFF signal is input to the INHMON terminal, that is, when it determines that an ON signal is input to the INHMON terminal (No), processor 210A of microcomputer 210 advances the procedure to step 62.

In step 62, processor 210A of microcomputer 210 diagnoses to the effect that a fixed ON is generated at the INH terminal of wake-up circuit 230. After this, processor 210A of microcomputer 210 advances the procedure to step 63.

In step 63, processor 210A of microcomputer 210 outputs a normal mode signal to wake-up circuit 230 from the MODE terminal. Wake-up circuit 230, to which the normal mode signal is input, undergoes transition from the sleep mode to the normal mode, and continues to output an ON signal to AND circuit 250 from the INH terminal.

In step 64, processor 210A of microcomputer 210 determines whether or not an ON signal is input to the INHMON terminal. In addition, when it determines that an ON signal is input to the INHMON terminal (Yes), processor 210A of microcomputer 210 advances the procedure to step 66. On the other hand, when it determines that no ON signal is input to the INHMON terminal, that is, an OFF signal is input to the INHMON terminal (No), processor 210A of microcomputer 210 advances the procedure to step 65.

In step 65, processor 210A of microcomputer 210 diagnoses to the effect that a fixed OFF is generated at the INH terminal of wake-up circuit 230. After this, processor 210A of microcomputer 210 advances the procedure to step 66.

In step 66, processor 210A of microcomputer 210 repeatedly executes normal control to control the control object apparatus until ignition switch 510 is operated from ON to OFF. After this, processor 210A of microcomputer 210 advances the procedure to step 43 shown in FIG. 13.

As in the second diagnosis processing, in the control processing into which the fourth diagnosis processing is incorporated, it is possible to determine which of a fixed ON and a fixed OFF occurs at the INH terminal of wake-up circuit 230. As for the other effects and advantages, they are the same as those of the third diagnosis processing, so description thereof will be omitted. If necessary, the description of the third diagnosis processing may be referred to.

Regarding the technical idea described above with reference to various embodiments, it will be easy for those skilled in the art to see that it is possible to produce new embodiments through omission of a part thereof, an appropriate combination of a part thereof, or substitution of a part thereof with a well-known technique.

For example, forced cutoff circuit 240 may be formed by some other microcomputer which is of lower power consumption and lower processing capacity than microcomputer 210. Furthermore, forced cutoff circuit 240 may be realized through software adopted in microcomputer 210.

REFERENCE SYMBOL LIST

200 electronic control device
210 microcomputer
220 relay switch
230 wake-up circuit
240 forced cutoff circuit
300 OTA electronic control device (external apparatus)
520 power relay

The invention claimed is:

1. An electronic control device comprising: a microcomputer; a wake-up circuit; and a relay switch self-retaining a power relay, the wake-up circuit operating the relay switch in response to a wake-up signal and starting power supply to the microcomputer to cause starting-up,
wherein, during shutdown processing, the microcomputer outputs a stop command to the relay switch before outputting a stop command to the wake-up circuit, whereby an output terminal of the wake-up circuit is diagnosed for fixation based on an output signal from the wake-up circuit.

2. The electronic control device according to claim 1, further comprising a monitor circuit monitoring a signal output from an output terminal of the wake-up circuit,
wherein, based on whether or not the wake-up circuit outputs a signal in conformity with an operation command with respect to the relay switch and the wake-up circuit, the microcomputer determines whether a fixed ON in which an ON signal is constantly output from the output terminal, is generated, or whether a fixed OFF in which an OFF signal is constantly output from the output terminal, is generated.

3. The electronic control device according to claim 2, further comprising a forced cutoff circuit forcibly turning OFF the power relay via the relay switch,
wherein when the microcomputer determines that a fixed ON is generated at an output terminal of the wake-up circuit, the power relay is forcibly turned OFF by the forced cutoff circuit.

4. The electronic control device according to claim 2, wherein, in initialization processing in which the microcomputer is started up, the microcomputer determines whether a fixed ON in which an ON signal is constantly output from the output terminal, is generated, or whether a fixed OFF in which an OFF signal is constantly output from the output terminal, is generated, based on whether or not the wake-up circuit outputs a signal in conformity with an operation command with respect to the relay switch and the wake-up circuit.

5. The electronic control device according to claim 2, wherein when the microcomputer diagnoses that a fixed ON is generated at an output terminal of the wake-up circuit, transition is caused to a low power consumption mode in which power consumption for the microcomputer is reduced.

6. The electronic control device according to claim 1, wherein when the microcomputer diagnoses that fixation is generated at an output terminal of the wake-up circuit, a notification device notifying to diagnosis result, is operated.

7. The electronic control device according to claim 1, wherein the wake-up signal is transmitted from an external apparatus.

8. A wake-up circuit diagnosing method, in which a microcomputer of an electronic control device includes a wake-up circuit operating a relay switch self-retaining a power relay in response to a wake-up signal to start power supply to the microcomputer to cause starting-up,
wherein the microcomputer diagnoses, during shutdown processing, an output terminal of the wake-up circuit in terms of fixation based on an output signal from the wake-up circuit by outputting a stop command to the relay switch before a stop command is output to the wake-up circuit.

9. The wake-up circuit diagnosing method according to claim 8, wherein the electronic control device further comprises a monitor circuit monitoring a signal output from an output terminal of the wake-up circuit, and
wherein, based on whether or not the wake-up circuit outputs a signal in conformity with an operation command with respect to the relay switch and the wake-up circuit, the microcomputer determines whether a fixed ON in which an ON signal is constantly output from the output terminal, is generated, or whether a fixed OFF in which an OFF signal is constantly output from the output terminal, is generated.

10. The wake-up circuit diagnosing method according to claim 9, wherein the electronic control device further comprises a forced cutoff circuit forcibly turning OFF the power relay via the relay switch, and
wherein the power relay is forced to turn OFF by the forced cutoff circuit when the microcomputer determines that a fixed ON is generated at an output terminal of the wake-up circuit.

11. The wake-up circuit diagnosing method according to claim 9, wherein, in initialization processing in which the microcomputer is started up, the microcomputer determines whether a fixed ON in which an ON signal is constantly output from the output terminal, is generated, or whether a fixed OFF in which an OFF signal is constantly output from the output terminal, is generated, based on whether or not the wake-up circuit outputs a signal in conformity with an operation command with respect to the relay switch and the wake-up circuit.

12. The wake-up circuit diagnosing method according to claim 9, wherein when the microcomputer diagnoses that a fixed ON is generated at an output terminal of the wake-up circuit, transition is caused to a low power consumption mode in which power consumption for the microcomputer is reduced.

13. The wake-up circuit diagnosing method according to claim 8, wherein when the microcomputer diagnoses that fixation is generated at an output terminal of the wake-up circuit, a notification device notifying to diagnosis result, is operated.

14. The wake-up circuit diagnosing method according to claim 8, wherein the wake-up signal is transmitted from an external apparatus.

* * * * *